United States Patent [19]

Treiber

[11] Patent Number: 5,564,159

[45] Date of Patent: Oct. 15, 1996

[54] CLOSED-LOOP MULTISTAGE SYSTEM FOR CLEANING PRINTED CIRCUIT BOARDS

[75] Inventor: John H. Treiber, Huntington Beach, Calif.

[73] Assignee: The John Treiber Company, Nashua, N.H.

[21] Appl. No.: 249,880

[22] Filed: May 26, 1994

[51] Int. Cl.$^6$ ........................................... B08B 3/02
[52] U.S. Cl. .................. 15/302; 134/72; 134/109
[58] Field of Search ................... 15/302; 134/72, 134/109

[56] References Cited

U.S. PATENT DOCUMENTS

| | | | |
|---|---|---|---|
| 2,746,466 | 5/1956 | Clague et al. | 134/72 |
| 3,598,131 | 8/1971 | Weihe | 134/109 X |
| 3,694,847 | 10/1972 | Hetman et al. | 15/302 |
| 4,076,554 | 2/1978 | Weihe | 134/72 X |
| 4,319,930 | 3/1982 | Yano et al. | 134/72 X |
| 5,032,187 | 7/1991 | Lawless | 15/302 X |
| 5,062,438 | 11/1991 | Michiletti | 15/302 X |
| 5,190,065 | 3/1993 | Kovac et al. | 134/107 |

Primary Examiner—Chris K. Moore
Attorney, Agent, or Firm—Hawes & Fischer

[57] ABSTRACT

The closed-loop multistage printed circuit board cleaning system applies a generous flow of water to rinse printed circuit boards previously cleaned in a wash section, the water then being recirculated through a purification system and reused to clean the printed circuit boards. When the printed circuit boards require application of a saponified liquid for adequate cleaning, the saponified liquid is applied in pre-wash and wash stages, the boards thereafter being air blasted to remove substantially all of the saponified liquid before they are rinsed. In the saponified system, the pre-wash and wash water is recycled within the pre-wash and wash stages themselves, then passed to a drain. In a system that does not require saponification, the wash liquid also may be recycled, thereby permitting both the wash and rinse stage to employ generous flows of water.

10 Claims, 6 Drawing Sheets

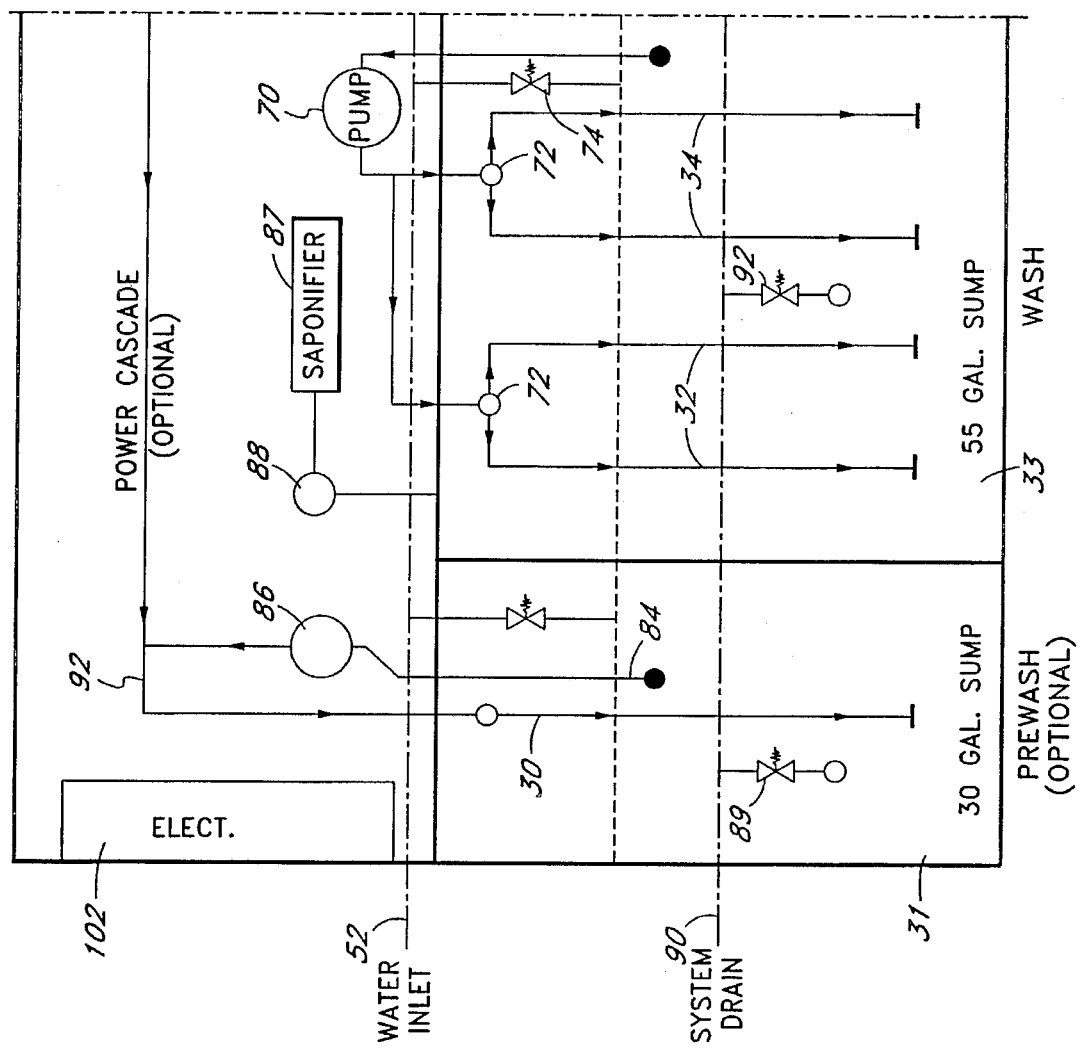
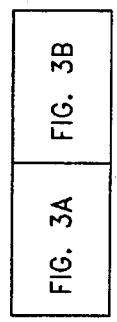

5,564,159

CLOSED-LOOP MULTISTAGE SYSTEM FOR CLEANING PRINTED CIRCUIT BOARDS

BACKGROUND

The present invention relates to a closed-loop multistage cleaning system and process, particularly one adapted to clean printed circuit boards of flux residue after a soldering operation.

Various systems and processes exist for cleaning printed circuit boards of flux residue. In general, such systems are characterized by a conveyer that transports the printed circuit boards to be cleaned through a housing in which they are subjected to a washing operation, then a rinsing operation, then a drying operation. Such systems in the past have been designed to accept water from a supply, such as a municipal water supply, use it in the washing and rising operation, then dispose of the water to an appropriate drain. More recently, some systems have been designed to recycle at least some of the water in the system through a processor that removes from the water residue entrained during the cleaning operation, then to return the processed water to the cleaning system, the processed water being of a purity at least comparable to that coming from a municipal water supply.

Aqueous cleaning systems such as the foregoing, whether combined with a closed-loop recycling and purification system or not, are designed to use a minimum amount of water. This limitation places significant constraints on the design of the cleaning system. Without such constraints an improved cleaning system could be designed.

Accordingly, one object of the present invention is to design an improved aqueous cleaning system and process for printed circuit boards and the like. Another object is to provide such a system that is compact, energy efficient, and that discharges to the drain a minimum of amount water. These and other objects of the present invention will be apparent to those skilled in the field from the following description of preferred embodiments.

BRIEF SUMMARY OF THE INVENTION

The present invention provides a closed-loop multistage aqueous cleaning system and process particularly designed for cleaning printed circuit boards of solder flux and other common containments. It includes a wash stage that applies a flow of wash liquid to articles to be cleaned, such as printed circuit boards, the wash liquid flowing to a first sump. The articles being cleaned are transported through this wash stage and then to a series of subsequent stages. These subsequent stages include a rinse stage in which a high volume flow of rinse liquid is applied to the articles being cleaned after they have passed through the wash stage, and a dryer stage for removing substantially all the liquid from the cleansed articles leaving the rinse stage. Liquid recycling means are also provided for removing substantially all entrained materials from the liquid used in one or more of the stages. Pump means are provided to recycle the liquid used in at least one of the stages to the liquid recycling means, and to apply the cleansed liquid produced by the liquid recycling means to one or more of the stages.

Appropriate sumps may be provided in the system to collect liquid used in the wash stage and liquid used in the rinse stage. The wash stage sump liquid may be used as the liquid source for the recycling means and the rinse stage liquid applied to replenish the liquid used by the wash stage. Fresh liquid may be added to the rinse stage together with the rinse from the liquid recycling means. A pre-wash stage also may be employed to apply a flow of liquid to the articles to be cleaned prior to their passage through the wash stage.

The liquid recycling means may include one or more filters for removing particulate matter from the liquid and at least one deionizing filter for removing ionic contaminants from the recycled liquid. Control means may be included to selectively activate the various components of the system as required to appropriately clean articles.

The invention also provides a process for cleaning articles, such as printed circuit boards, comprising the steps of washing the articles with a wash liquid, the liquid flowing to a wash liquid sump, rinsing the articles that have been washed using a high volume flow of rinse liquid, then drying the rinsed articles to remove substantially all of the liquid, and recycling at least some of the liquid in one or more sumps to remove substantially all of the entrained materials, thereby to provide a source of liquid appropriate for use at least in the rinsing operation.

BRIEF DESCRIPTION OF THE DRAWINGS

The present invention will be described in connection with the accompanying drawings in which.

DETAILED DESCRIPTION

The present invention is based upon a simple but highly significant realization: whereas previous systems for cleaning articles such as printed circuit boards have been designed to use a minimum amount of cleaning liquid, such as water, if the system is a closed loop system and incorporates a structure for recycling a significant volume of water used in the cleaning operation, it is no longer necessary to use a minimum amount of water in the cleaning operation. In other words, because the cleaning liquid is being recycled, rather than discharged to a drain, a significantly greater volume of liquid may be used to clean the printed circuit boards than has been possible in previous systems designed to accept a source of water from a municipal water utility and, after use in the system, to dispose of that water to a drain. While closed-loop systems, or structure for turning such cleaning systems into closed-loop systems, have been introduced in the past, until the present invention no system has been designed based on the realization that such a closed-loop facility removes a major limitation on the design of the cleaning system, i.e. that it must use a minimum amount of water. It still should accept and discharge a minimum amount of water, or other cleaning liquid. But within the system itself, because of its closed-loop recycling capability, generous flows of water may be employed.

There are two basic designs or styles of cleaning systems for printed circuit boards. They arise from the two significantly different types of fluxes used in soldering components to printed circuit boards. One type of flux is commonly referred to as an organic or acid flux; the other type of flux is commonly referred to a rosin flux. When a rosin based flux is used, the cleaning system requires saponification (or soap) to adequately remove the flux residue. If an acid based flux has been used, then the cleaning system need not employ saponification but may simply use a cleaning liquid such as water, preferably of high purity.

Figure 1:
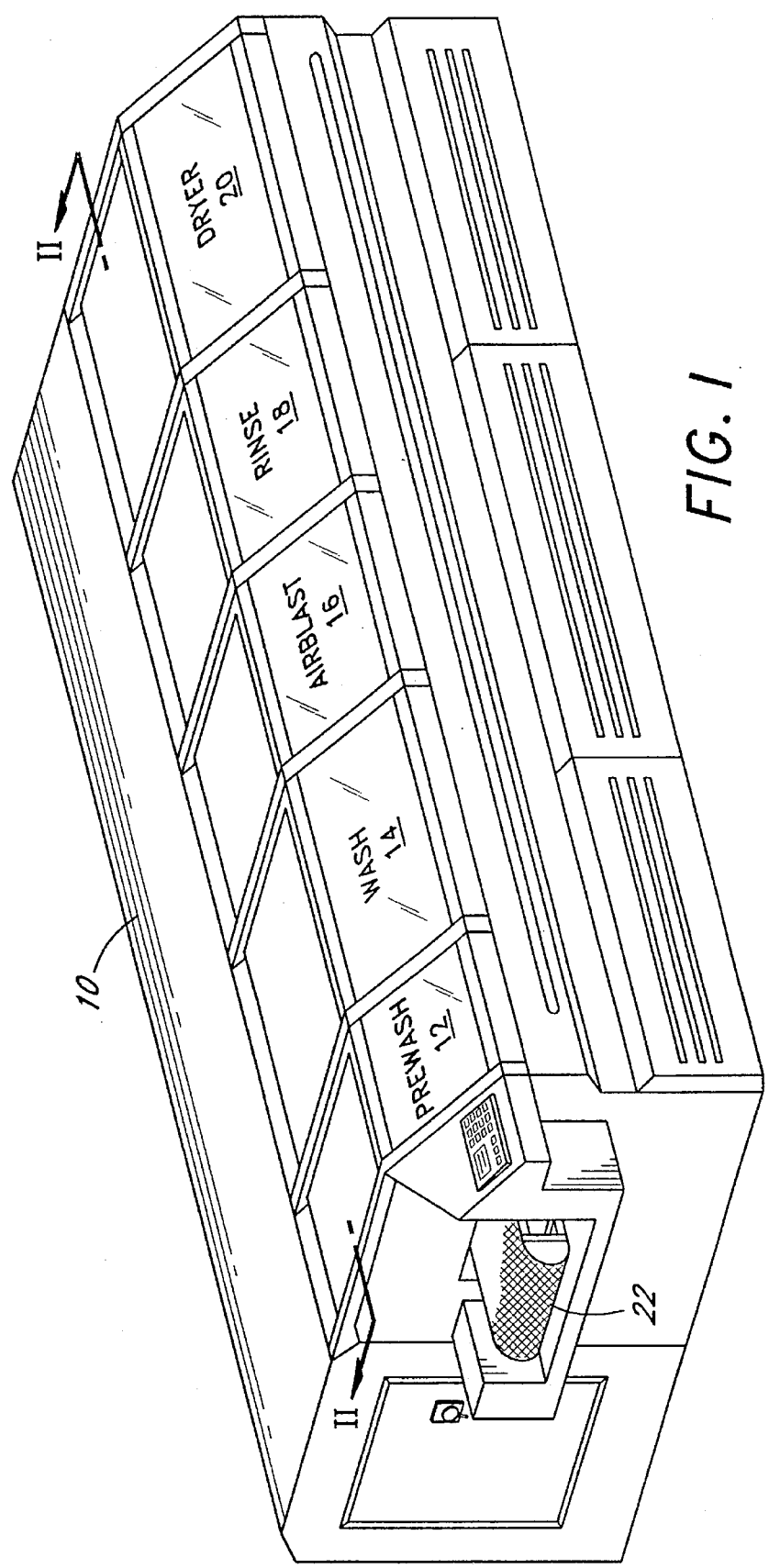
FIG. 1 is a perspective view of one embodiment of the closed-loop multistage cleaning system.

An aqueous cleaning system employing saponification cleaning is shown in FIG. 1. It is contained within a housing 10 that includes a series of lids or doors along its front top portion, these doors consisting of a pre-wash section door 12, a wash door 14, an air blast door 16, a rinse door 18 and a dryer door 20. Each door permits the operator to have access to a portion of the system contained within the housing.

Printed circuit boards to be cleaned are placed on a mesh conveyer belt 22 which, when the system is operating, transports the printed circuit boards through the pre-wash, wash, air blast, rinse and drying stages of the system in that order, depositing the clean printed circuit boards into an appropriate receptacle after they exit the dryer stage.

Figure 2:
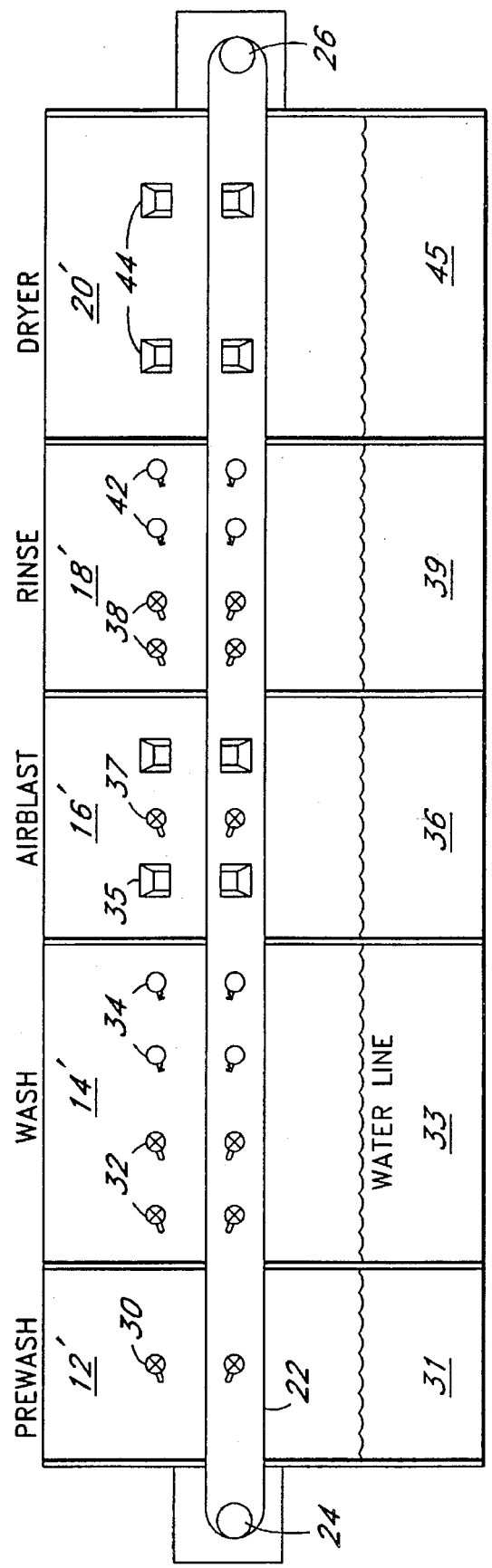
FIG. 2 is a vertical cross-sectional view of the cleaning system taken on lines II—II of FIG. 1.

A vertical cross-section of the cleaning system is shown in FIG. 2, taken generally on lines II—II of FIG. 1. As it shows, the mesh conveyer belt 22, mounted and supported by appropriate rollers including an entrance roller 24 and an exit roller 26, transports the printed circuit boards sequentially through the pre-wash stage 12', the wash stage 14', the air blast stage 16', the rinse stage 18' and the dryer stage 20'. In the pre-wash stage 12' appropriate nozzles 30 apply a cleaning liquid, such as water, to both the upper and lower surface of the printed circuit boards on the mesh conveyer belt 22. In general, this liquid is applied at a relatively moderate pressure and medium volume.\* By this spray, the PC boards in this stage will be cleansed of gross debris and residue, such as solder balls. They may also be preconditioned for thorough cleaning in the next stage—the wash stage—by adding an appropriate saponifier, if desired, to prepare the rosin flux residue for removal by the system and to remove some of that residue in the pre-wash stage itself. If just water is used to remove debris from the boards, and is not recirculated, the flow through nozzles 30 may be on the order of 4 gpm at 15 psi. If the liquid flowing through nozzles 30 is recirculated, the flow may be on the order of 60 gpm at 20 psi. Preferably this water is heated to about 140° F. The water in the pre-wash stage may be recirculated from the sump 31 through nozzles 30; fresh water is added from one of the next stages, and discharged to an appropriate drain.

\*Pressures and flows may be characterized as: for pressure, low (0–20 psi), medium (20–50 psi) and high (>50 psi) and for flows, low (0–30 gpm), medium (30–60 gpm) and high (>60 gpm).

Next, the pre-washed printed circuit boards pass through wash stage or section 14'. In it, a series of nozzles 32 apply cleaning liquid to the printed circuit boards, preferably at a relatively high pressure (100 psi) and a relatively high volume (80 gpm)—and at a temperature of about 145° F. This cleaning liquid, usually water, after being applied to the printed circuit boards falls into a sump 33. Additional water is applied to the boards by nozzles 34, preferably also at a relatively high pressure and high volume, to adequately remove residue under surface mounted devices, this water also falling to sump 33. More particularly, nozzles 34 direct a blast of water moving at several hundred feet per second onto the PC boards in an orientation counter to their direction of movement, thereby to shear across the boards and remove contaminants even from under surface mounted devices, a clearance on the order of 0.001".

The washed printed circuit boards are then passed through an air blast section 16' in which they are subjected to a high volume, high pressure flow of air from nozzles 35 fed from an appropriate air turbine or the like, the water blasted from the boards by the air flow from these nozzles falling into sump 36. Preferably the air blast nozzles, or knives, are oriented to direct air onto the articles being cleaned in an orientation counter to the movement of these articles through the system. This air blast section serves to isolate the wash stages, and their saponified liquid, from the rinse and dryer stages thereby to minimize the drag-over of water into these stages. To further reduce dragging wash water, with its saponifier, into the rinse stage, a set of mist spray nozzles 37 may be provided in air blast stage 16', the flow through nozzles 37 being on the order of 2–3 gpm. The liquid flowing through nozzles 37 may come from the sump of the rinse stage, and also may serve to replenish the prewash liquid if desired. This spray may be followed by a second set of air blast nozzles.

Next, the air blasted printed circuit boards pass through a rinse section 18' in which they are subjected first to a medium pressure (30–35 psi) and high flow (60–70 gpm) of rinse liquid, such as water, from nozzles 38, this liquid falling into a sump 39. Nozzles 42 are provided to direct a generous flow of water (30 gpm at 60–70 psi) onto the rinsed circuit boards, this water causing substantially all remaining flux residue, loose solder balls, and other physical and chemical residue, to be removed from the rinsed printed circuit boards, this water also falling into sump 39. Thus, in the rinse stage the high pressure, high volume water flow will be at a rate of 20 gal./min. or higher, which may be described as a generous flow.

The rinsed printed circuit boards then pass into dryer stage or section 20' in which they are subjected to a high volume, high pressure flow of air from nozzles 44 fed by an appropriate air turbine or the like, this air flow causing substantially all of the cleaning liquid to be removed from the printed circuit boards. A small amount of water will drop from these printed circuit boards into sump 45.

The printed circuit boards exiting the dryer section 20' are substantially dry and cleansed of all flux and solder residue.

While volumes and pressures of cleaning liquid flows have been given in the preceding description, they are for illustrative purposes only. In general, the volumes and pressures flowing through the various nozzles will be determined by the size of printed circuit boards to be cleaned, as well as the types of connectors and number or density of components they carry—the larger and more complex the board, the higher should be the flow volumes and pressures through the various nozzles.

If the cleaning system is designed to remove rosin flux from the printed circuit boards, as previously indicated, many prefer to use a saponifier as part of that cleaning operation. This saponifier may not be applied to a liquid recirculating system designed to remove from the liquid being recirculated contaminants entrained during the cleaning operation, for the soap will typically foul the liquid purifying system—specifically any deionizer it includes. For that reason, if a saponifier is being used it is normally applied in the wash stage 14', and possibly the pre-wash stage 12', as part of the liquid flowing from nozzles 30, 32 and 34. Thus, the liquid in sumps 31 and 33 may be recycled, but ultimately it will be discharged to a drain. Since saponifier will remain on the printed circuit boards passing from wash stage 14', the liquid in sump 36 also must eventually be discharged to a drain, although it may be recycled in the wash and pre-wash stages. To minimize liquid passing to the drain, preferably the pre-wash stage 12' and the wash stage 14' are designed to employ low pressure, medium volume flows of water through nozzles 30, 32 and 34. Some of the rinse stage liquid may be used as the source of liquid for the wash and pre-wash stages.

Since it is essential to eliminate this saponified liquid from the liquid being recycled, the wash stage preferably is followed by a series of air blast nozzles 35, preferably oriented to direct air from an appropriate turbine (preferably with a demister) onto the PC boards counter to the movement of the boards through the system, which nozzles remove substantially all of the cleaning liquid from the printed circuit boards before they pass into rinse stage 18'. Spray nozzles 37 also help to minimize drag-out of wash water into the rinse stage. In the rinse stage 18' a relatively moderate pressure and flow of water is applied by nozzles 38, this water falling from the printed circuit boards into sump 39. As with nozzles 34, this blast of water helps to thoroughly cleanse the PC boards. Any contaminants remaining on the boards is removed by a final high pressure, high volume flow of clean water from nozzles 42. Thus, the cleaning liquid, typically water in sumps 39 and 45, will be appropriate for recycling and purification; these sumps may be combined if desired.

Figure 3B:
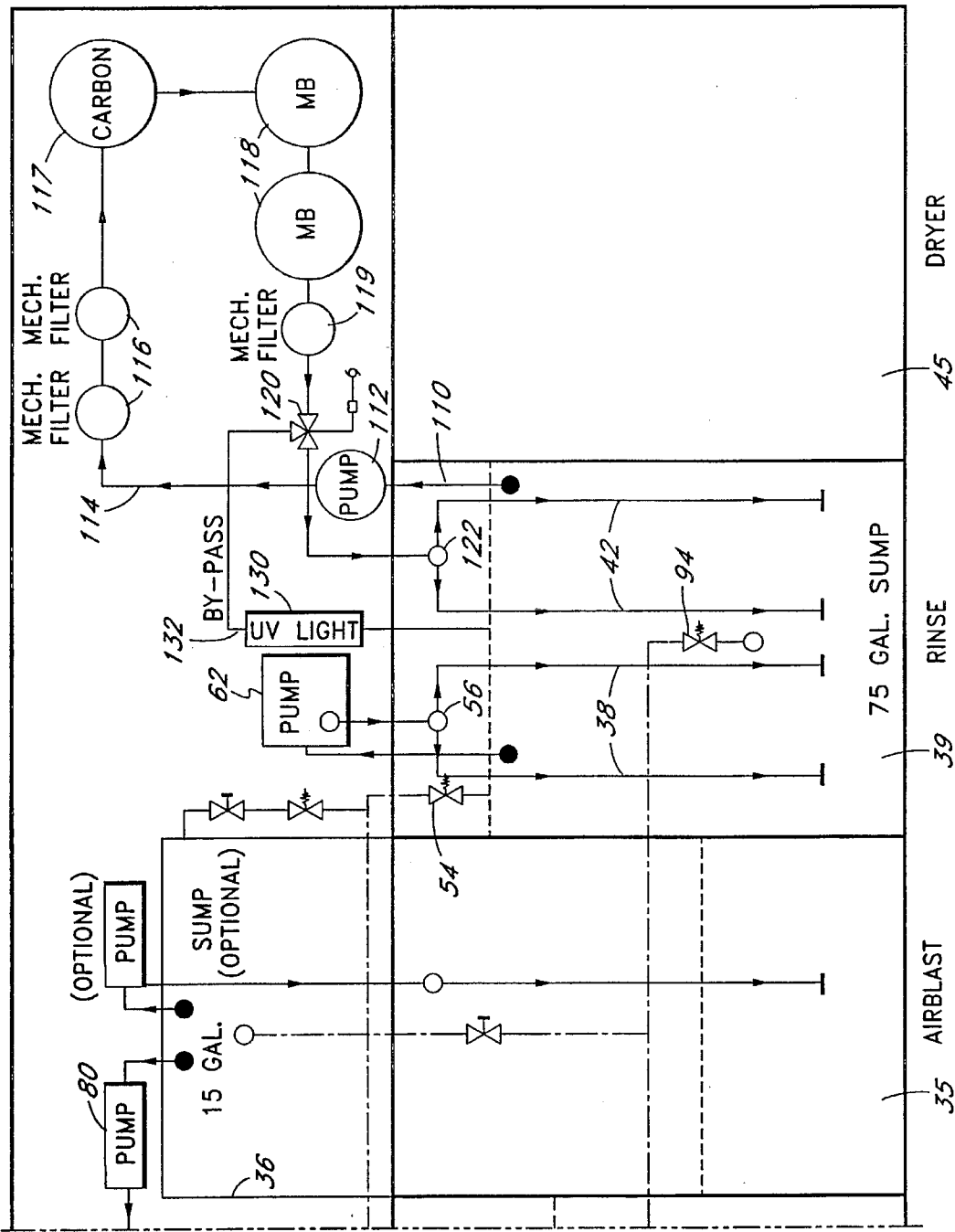
FIG. 3 is a key diagram of, and FIGS. 3A and 3B are detailed schematic diagrams of the water flow through the cleaning system shown in FIGS. 1 and 2.

An appropriate water flow schematic for the system shown in FIGS. 1 and 2 is presented in FIG. 3. It includes a water inlet line 52 that supplies makeup or recharging water though a valve 54 into sump 39. This water is boosted in pressure by pump 62, which may be a 3 hp single stage centrifugal pump, then applied through lines 56 to nozzles 38.

In the wash stage, wash water is drawn from sump 33 by pump 70 then applied through lines 72 to the wash section nozzles 32 and 34. Additional fresh water may be added as required to this wash stage from water line 52 through valve 74. This valve may be controlled by a level sensor in sump 33. Water is withdrawn from air blast sump 36 by pump 80 and directed through line 82 to nozzles 30. Or water may be recirculated in the pre-wash stage, the water being withdrawn from sump 31 through line 84 by pump 86 and fed through line 82 to nozzles 30. Pump 70 may be a 7½ hp multistage centrifugal pump. All pump seals should be selected to tolerate the expected chemical contaminants in the cleaning liquid.

Saponifier may be manually added from time to time in sump 33 of the wash stage, or an automated saponifier system may cause pump 87 to draw saponifier from reservoir 87 and discharged into the wash section sump 33.

Pre-wash water in sump 31 is periodically discharged through valve 89 to the system drain 90. Similarly, water from sump 33 is periodically discharged by valve 92 to the system drain 90, thereby to maintain the water levels in these sumps 31 and 33 within a desired range. In rinse stage 18' a valve 94 is provided to discharge rinse water to the system drain 90 as necessary. These various valves and pumps are all controlled by an appropriate electrical system 102. While the electrical controls may be manually actuated, preferably a computerized system responding to an appropriate program is employed to sense water levels in the various sumps and to pressurize and apply water to the various nozzles as the conveyer belt 22 transports printed circuit boards through the various stages of the system, the conveyer belt being driven by an appropriate electrical motor also being controlled by the electrical system 102. Of course appropriate sensors (not shown) are included to sense the water levels in the various sumps and (for example) whether or not additional saponifier is needed in the wash water flowing through lines 72.

The electrical system 102, in one version of the cleaning system, may provide a series of appropriate manually actuated controls and be used, while an operator monitors the operation of the system, to actuate or deactuate specific valves and pumps as required. In another version of the system, an appropriate computerized control is provided, preferably incorporating programmable logic to monitor the operation of the system to ensure that it remains within a desired operating range as it cleans PC boards or other articles. This system may also compile trend data for use by the operator to tune the system and to ensure that the various components continue to operate properly, or are replaced as required.

The cleaning system also includes appropriate blowers or turbines applying ambient or recirculated air through the various air blast nozzles in the air blast stage and dryer stage. By recirculating this air flow, because of the temperature increase resulting from its pressurization the air flowing through nozzles 44 in the dryer stage 20' will be significantly above ambient temperature and adequate to dry the printed circuit boards as they pass through the dryer stage 20'.

The system incorporates components to cleanse the recirculating liquid of contaminants entrained during the printed circuit board cleaning operation, thereby permitting this liquid to be recycled. If a saponifier is used, because the saponifier will contaminate certain parts of the recirculation or purification components (e.g. any deionizer) it is only possible to cleanse the liquid in rinse sump 39 and dryer sump 45. This liquid is withdrawn from the sump through a line 110 by pump 112 and applied to line 114. In this line is one or more mechanical filters 116, preferably first a 5μ paper filter then a 1μ woven filter, which filters remove particulate contaminants, such as solder balls, diatomaceous earth and the like, from the liquid flowing in line 114. This liquid then preferably flows through an activated carbon bed filter 117, then a series of mixed bed (cation and anion) deionizing columns or filters 118 (also called parsing units) which remove ions from the liquid. It is then applied through a final mechanical filter 119, such as a 1μ filter, to catch any particles coming from the deionizing filters, then through a valve 120 to a manifold 122 and from that manifold to rinse nozzles 42. Preferably valve 120 is a motorized ball valve to prevent occurrence of a water hammer, especially in the filters, on its closure. By appropriate selection of various filters it is possible to sufficiently cleanse the liquid withdrawn by pump 112 to result in a liquid flowing through nozzles 42 that is of a purity, for water, on the order of 15–18 megohm water, but if desired it may be of a somewhat lower purity and still be adequate. Reverse osmosis units may be used in the purification section if desired.

The generous water flow through at least the rinsing and cleaning portions of the present invention will not substantially increase the contaminants in the liquid being recirculated and purified, for the contaminants were from the articles being cleaned, and these articles have a given amount of contaminants. While more contaminants will be removed by the present system than many previous systems, resulting in cleaner articles, this does not substantially increase the contaminates to be removed by the purification system, or substantially reduce the useful life of the filters and deionizing components of the purification systems.

In a presently preferred construction of the system, the pre-wash sump 31 has a capacity on the order of 30 gallons. The wash sump has a capacity on the order of 55 gallons, and the air blast sump of 15 gallons. The rinse sump may be combined with the dryer sump and has a 75 gallon capacity. This rinse sump also serves as a reservoir for the purification or recirculation system, as previously described.

All cleansing systems, including the closed-loop system that has been described, operate only intermittently. When there are no printed circuit boards to be cleaned, the system is in a quiescent state. This may occur at some facilities repeatedly during a typical workday and at all facilities when they are closed and not in operation, such as at night or on weekends and holidays. If the water in the sumps is permitted to stagnate for significant periods of time, a bacterial or fungal growth may result. To prevent this, preferably electrical system 102 will sense the passage of time and periodically activate at least the recycling components including pump 112 to refresh the liquid by removing such contamination from the liquid in sump 39. Preferably an ultraviolet light component 130, such as a transparent tube surrounded by one or more ultraviolet lights, is included in a bypass line 132 feeding liquid from valve 120, the ultraviolet treatment being sufficient to kill any organisms in the liquid flowing through that line to sump 39.

In the saponifier system described in connection with FIGS. 1 through 3, in general the major flow of water will be from the water inlet to the rinse stage 18' to replenish water lost through evaporation. Since water is being recycled from sump 39 through the recycling system, a medium volume and medium flow of water may be employed in the rinse stage to thoroughly rinse the components (as contrasted with previous systems which attempted to minimize the flow of water through particularly the rinse stage). Water may also flow from the water inlet into the wash sump 33 where it is employed to thoroughly wash the printed circuit boards. Water entrained on these printed circuit boards will be removed in air blast stage 16', flowing to sump 36. Thus, the main flow of water to the system drain 90 will be from the pre-wash sump 31 and wash sump 33.

From time to time the system operator may deem it appropriate to clean the sumps and completely recharge the system with cleaning liquid. When that occurs, all of the drains in the various sumps will be opened to system drain line 90 to completely empty the sumps. Then the sumps will be manually scrubbed or otherwise cleaned and recharged with water from inlet 52 through the various valves provided for that purpose.

The closed-loop multistage printed circuit board cleaning system and process just described offers significant advantages over previous systems, including systems connected to a water recirculation and purification unit. Specifically, the present system is significantly smaller than previous systems. Because the purification system is included in housing 10, and designed as an integral part of the overall cleaning system, the separate sumps and pumps it would otherwise require are no longer necessary. A sump of the cleaning system is used by the purification system, as shown. Previous systems often were over 20' long whereas the present system is on the order of 12' long. The present system also requires significantly less plumbing, fewer pumps and sumps, and thus has both a reduced initial price and reduced operating costs, requiring less power than previous systems.

Figures 4, 4A:
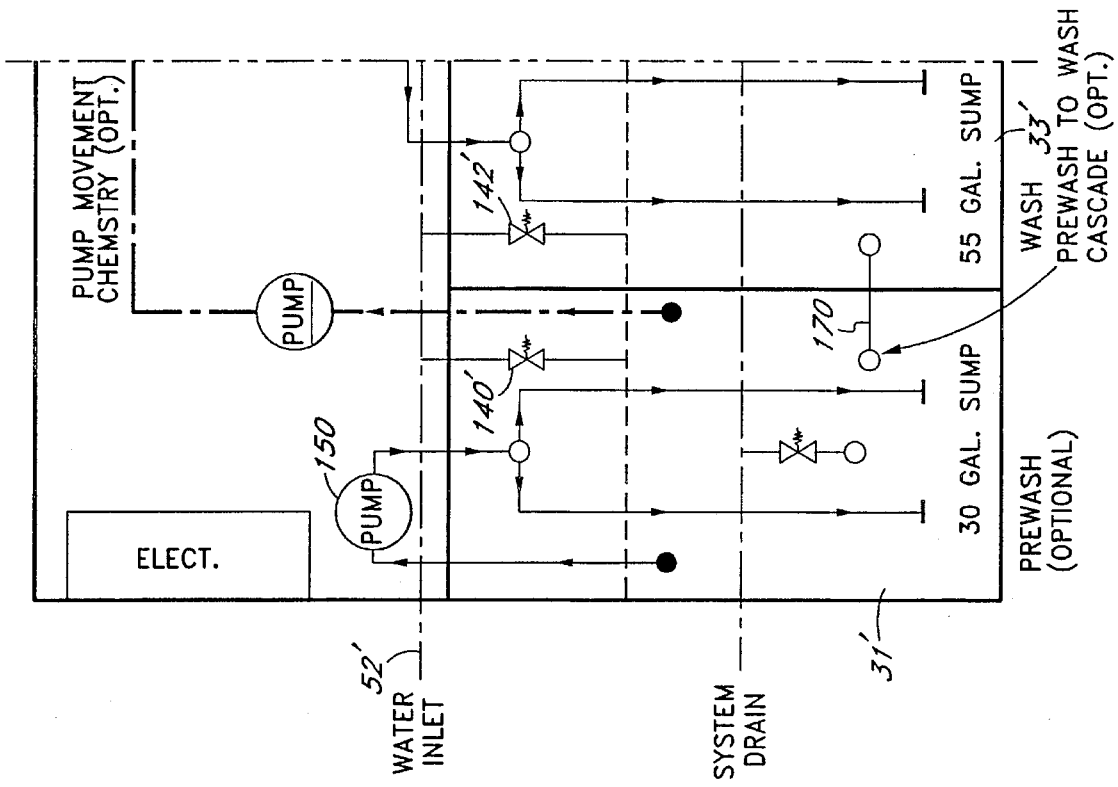
FIG. 4 is a key diagram of, and FIGS. 4A and 4B are detailed schematic diagrams of the water flow through a modified cleaning system.
Figure 4B:
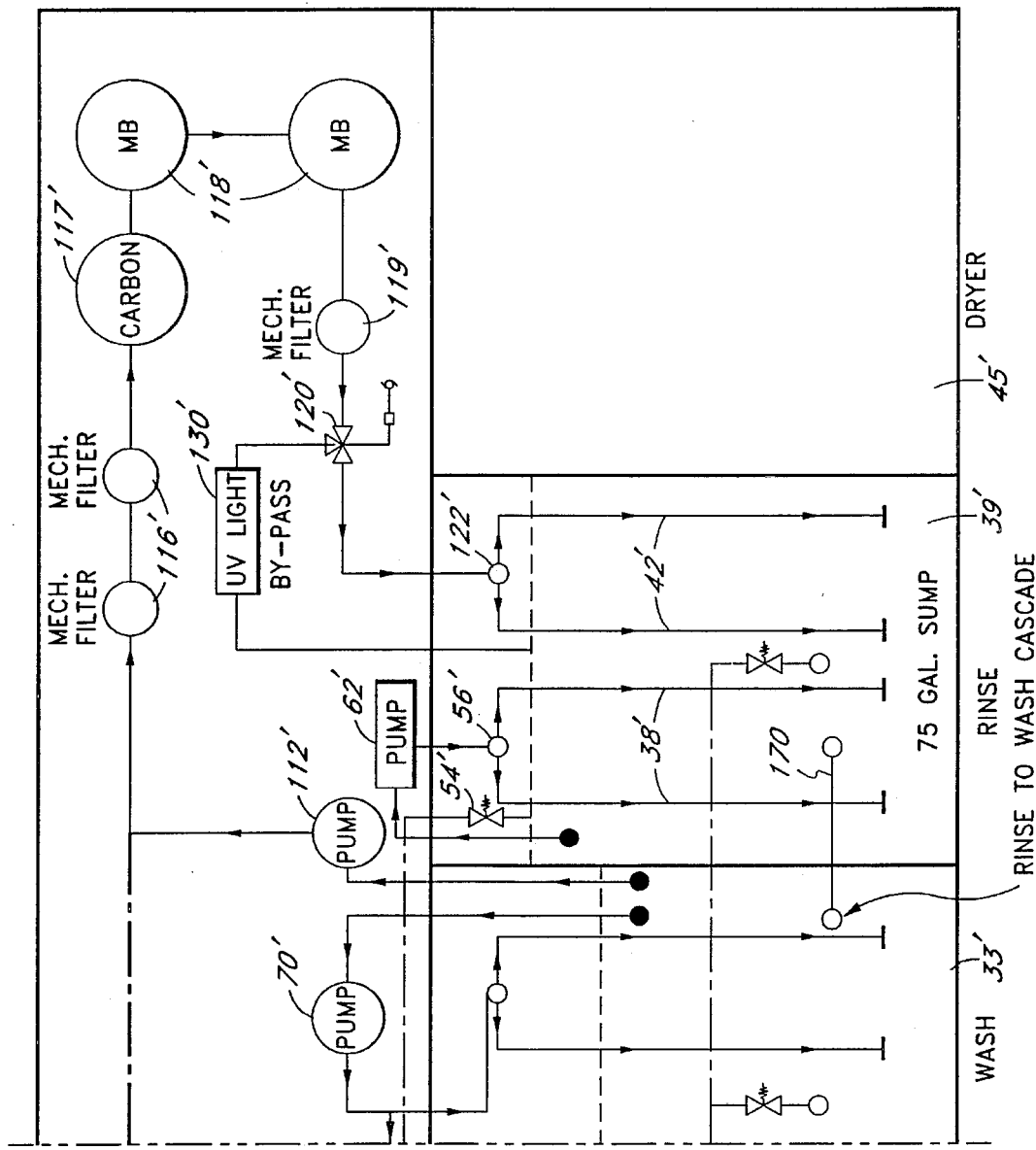

As indicated earlier, some types of printed circuit board cleaning systems are designed to remove solder fluxes that do not require saponification. In such systems it is possible to recycle virtually all of the water, for there is no saponifier to contaminate the recycler filters. Such aqueous systems typically will not include an air blast stage 16'—since it is not necessary to isolate the wash stage from the rinse stage—and may even eliminate the pre-wash stage 12' if desired. A cleansing liquid schematic for such an aqueous system is shown in FIG. 4. In it, water flows from a water inlet 52' through a valve 54' into the rinse sump 39'. It is withdrawn from that sump by pump 62' for application to the nozzles 38' of the rinse stage. Water also flows from water inlet line 52' on occasion through valve 140' to the pre-wash sump (an optional stage) and through valve 142' to the wash sump 33'. As in the previous system, wash water is withdrawn from the wash sump by pump 70' for application to the wash stage nozzles. It is also withdrawn from the pre-wash sump 31' by pump 150 for application to the pre-wash nozzles, if the system incorporates a pre-wash stage.

The recirculating section of this system locates pump 112' to withdraw water preferably from the wash stage sump 33' for application to mechanical filters 116' and then through an activated carbon bed filter 117' to cationic and anionic (or mixed bed) filters 118' after which it flows through a final mechanical filter 119; valve 120' and then to the rinse stage nozzles. As in the previous system, an ultraviolet light treatment by-pass component 130' is provided to kill any bacterial or fungal growth developing in the rinse sump 39'.

In this aqueous cleaning system, water will flow from the pre-wash sump through pump 150 to its nozzles to be applied to the printed circuit boards as they enter the system. Some of that water will flow through to the wash stage to be recirculated by pump 70' through the wash stage nozzles. It may be heated. Some of the wash stage water will flow into the rinse stage where it will be recirculated with the rinse water. Appropriate interconnections 170 may be provided between sumps 31', 33' and 39' to permit water to cascade back to wash sump 33'. Clean water enters the rinse stage after passage through the filter section and passes through the last set of nozzles in the rinse stage, namely nozzles 42'. Accordingly, the printed circuit boards passing into the dryer stage will have just been subjected to highest purity water included in the system. As a result, the printed circuit boards will be thoroughly cleansed of contaminants. This high purity water will be removed from the printed circuit boards in the dryer stage as previously described.

As previously noted, there are printed circuit board cleaning systems that have been attached to water purification and recirculating systems. In general, those cleaning systems are designed to use a minimum amount of water in each stage, for they were designed on the assumption that water flows from the water inlet through the system to the system drain. When purification or recirculating systems have been added to such cleaning systems, these recirculating systems have included their own pumps and sumps, thereby to periodically withdraw water from the cleaning system for purification and recirculation into the cleaning system.

Such prior systems differ from the present system not only by virtue of the design philosophy they reflect, as previously described, but also by virtue of the additional components they include. Typically they will have their own pumps and sumps (usually at least 2 of each). In contrast, the present system uses the sumps of the cleaning system and only requires a single pump to recirculate water through the purification system, in the preferred embodiment. Since the liquid purified in this recirculation system is the last liquid applied to the printed circuit boards during the cleaning operation, and since it typically is of a purity at least as high as (and most often considerably higher than) water flowing into the system from a municipal or similar supply, often the printed circuit boards cleansed by the present system will have significantly fewer contaminants on them after being cleaned than those printed circuit boards cleansed by other systems.

While preferred embodiments of the invention have been shown and described, it will be apparent to those skilled in this art that various modifications may be made in these embodiments without departing from the spirit of the invention. For that reason, the scope of the invention is set forth in the following claims.

I claim:

1. A closed-loop multistage cleaning system through which articles to be cleaned are passed, the system including:

wash stage means applying a flow of wash liquid to the articles to be cleaned, the wash stage means having a wash liquid sump receiving liquid flowing from the articles being washed;

rinse stage means applying a flow of rinse liquid to the articles to be cleaned in the wash stage means, the rinse stage means having a rinse liquid sump receiving liquid flowing from the articles being rinsed;

dryer means removing substantially all liquid from the articles exiting the rinse stage means;

liquid recycling means removing substantially all entrained materials from at least the liquid used in one of the wash stage means and the rinse stage means and producing the rinse liquid;

pump means to apply pressure to the liquid used in the wash stage means and rinse stage means so that the liquid is supplied to and forcefully sprayed at each of the wash stage means and the rinse stage means;

means to convey articles to be cleaned through the wash stage means, rinse stage means and dryer means; and a housing receiving and supporting all of the foregoing means.

2. A closed-loop cleaning system as set forth in claim 1 in which the liquid recycling means includes a single pump to recycle liquid from at least one of the wash liquid sump and the rinse liquid sump through the liquid recycling means.

3. A closed-loop cleaning system as set forth in claim 1 including means to treat the liquid in at least one of the wash liquid sump and the rinse liquid sump with ultraviolet radiation.

4. A closed-loop cleaning system as set forth in claim 1 including dryer stage sump means collecting liquid falling from the articles conveyed through the said dryer means.

5. A closed-loop cleaning system as set forth in claim 1 in which the pump means applies liquid collected in the rinse stage sump to the liquid recycling means.

6. A closed-loop cleaning system as set forth in claim 1 in which the pump means applies liquid collected in the wash stage sump to the liquid recycling means.

7. A closed-loop cleaning system as set forth in claim 1 including pre-wash stage means applying a flow of liquid to articles to be cleaned prior their passage into the wash stage means.

8. A closed-loop cleaning system as set forth in claim 1 in which the liquid recycling means includes filter means removing particulate matter from the liquid flowing to the liquid recycling means, and at least one deionizing filter removing ionic contaminants from the liquid flowing to the liquid recycling means.

9. A closed-loop cleaning system as set forth in claim 1 including liquid refreshment means selectively recycling liquid through the liquid recycling means to stop microbial growth during periods when the system is not being used to clean articles.

10. A closed-loop cleaning system as set forth in claim 1 including control means to selectively activate the various means of the system thereby to clean articles.

* * * * *